United States Patent
Kim et al.

(10) Patent No.: US 12,040,391 B2
(45) Date of Patent: Jul. 16, 2024

(54) POWER DEVICE AND METHOD OF MANUFACTURING THE SAME

(71) Applicant: Samsung Electronics Co., Ltd., Suwon-si (KR)

(72) Inventors: Joonyong Kim, Seoul (KR); Sunkyu Hwang, Seoul (KR); Jongseob Kim, Seoul (KR); Junhyuk Park, Pohang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 410 days.

(21) Appl. No.: 17/398,407

(22) Filed: Aug. 10, 2021

(65) Prior Publication Data

US 2022/0320327 A1 Oct. 6, 2022

(30) Foreign Application Priority Data

Apr. 6, 2021 (KR) .................. 10-2021-0044869

(51) Int. Cl.
*H01L 29/66* (2006.01)
*H01L 29/20* (2006.01)
*H01L 29/40* (2006.01)
*H01L 29/778* (2006.01)

(52) U.S. Cl.
CPC ...... *H01L 29/7786* (2013.01); *H01L 29/2003* (2013.01); *H01L 29/404* (2013.01); *H01L 29/407* (2013.01); *H01L 29/66462* (2013.01)

(58) Field of Classification Search
CPC ............ H01L 29/7786; H01L 29/2003; H01L 29/404; H01L 29/407; H01L 29/66462; H01L 23/3192; H01L 29/401; H01L 29/1066; H01L 29/778; H01L 29/402

USPC .......................................................... 257/76
See application file for complete search history.

(56) References Cited

U.S. PATENT DOCUMENTS

| 10,439,029 B2 | 10/2019 | Li et al. |
| 10,651,304 B2 | 5/2020 | Iucolano |
| 2004/0174420 A1* | 9/2004 | Kitamura ............... C09D 11/40 347/100 |

(Continued)

FOREIGN PATENT DOCUMENTS

CN 111128962 A 5/2020

OTHER PUBLICATIONS

Takayuki Fukasawa et al., 'Microloading Effect in Highly Selective $SiO_2$ Contact Hole Etching Employing Inductively Coupled Plasma' *Jpn. J. Appl. Phys.*, vol. 33, Dec. 1994, pp. 7042-7046.

(Continued)

*Primary Examiner* — Sheikh Maruf
(74) *Attorney, Agent, or Firm* — HARNESS, DICKEY & PIERCE, P.L.C.

(57) ABSTRACT

Provided are a power device and a method of manufacturing the same. The power device may include a channel layer; a source and a drain at respective sides of the channel layer; a gate on the channel layer between the source and the drain; a passivation layer covering the source, the drain, and the gate; and a plurality of field plates in the passivation layer. The plurality of field plates may have different thicknesses. The plurality of field plates may have different widths, different pattern shapes, or both different widths and different pattern shapes.

13 Claims, 14 Drawing Sheets

(56) References Cited

U.S. PATENT DOCUMENTS

| | | | |
|---|---|---|---|
| 2013/0134435 A1* | 5/2013 | Yu | H01L 29/205 |
| | | | 257/E21.403 |
| 2013/0161638 A1* | 6/2013 | Yao | H01L 29/66462 |
| | | | 257/E21.403 |
| 2015/0115326 A1* | 4/2015 | Prechtl | H01L 29/7786 |
| | | | 257/471 |
| 2017/0294532 A1* | 10/2017 | Kudymov | H01L 29/7787 |
| 2018/0113644 A1* | 4/2018 | Arroyo | G06F 3/0647 |
| 2018/0113823 A1* | 4/2018 | Arroyo | G06F 11/142 |
| 2018/0151712 A1* | 5/2018 | Ningaraju | H01L 29/7787 |
| 2018/0331191 A1 | 11/2018 | Then et al. | |
| 2018/0337239 A1* | 11/2018 | Li | H01L 29/402 |
| 2019/0027594 A1* | 1/2019 | Kudymov | H01L 29/41775 |
| 2019/0131427 A1* | 5/2019 | Yu | H01L 21/2258 |
| 2019/0245046 A1* | 8/2019 | Yao | H01L 29/402 |
| 2021/0005739 A1* | 1/2021 | Sun | H01L 29/205 |

OTHER PUBLICATIONS

Extended European Search Report dated Feb. 22, 2022, issued in corresponding European Patent Application No. 21193464.1.

* cited by examiner

POWER DEVICE AND METHOD OF MANUFACTURING THE SAME

CROSS-REFERENCE TO RELATED APPLICATION

This application is based on and claims priority under 35 U.S.C. § 119 to Korean Patent Application No. 10-2021-0044869, filed on Apr. 6, 2021, in the Korean Intellectual Property Office, the disclosure of which is incorporated by reference herein in its entirety.

BACKGROUND

1. Field

The present disclosure relates to power devices and/or methods of manufacturing the same.

2. Description of the Related Art

Various power conversion systems may require a device that controls a current flow through on/off switching, e.g., a power device. In a power conversion system, the efficiency of the entire system may depend on the efficiency of the power device.

It has become more difficult to improve the efficiency of silicon-based power devices due to limitations in silicon properties and manufacturing processes. To overcome such limitations, research and development has been conducted to enhance the conversion efficiency by applying group III-V compound semiconductors, such as GaN, etc. to the power device. Recently, a high electron mobility transistor (HEMT) using a heterojunction structure of a compound semiconductor has been studied.

SUMMARY

Provided are power devices and/or methods of manufacturing the same.

Additional aspects will be set forth in part in the description which follows and, in part, will be apparent from the description, or may be learned by practice of the presented embodiments of the disclosure.

According to an embodiment, a power device may include a channel layer; a source and a drain at respective sides of the channel layer; a gate on the channel layer between the source and the drain; a passivation layer covering the source, the drain and the gate; and a plurality of field plates in the passivation layer. The plurality of field plates may have different thicknesses. The plurality of field plates may have different widths, different pattern shapes, or both different widths and different pattern shapes.

In some embodiments, distances between the channel layer and the plurality of field plates may increase along a direction from the gate toward the drain.

In some embodiments, the plurality of field plates may decrease in width in the direction from the gate toward the drain.

In some embodiments, each of the plurality of field plates may include one or more subplates, and the one or more subplates in the plurality of field plates may decrease in size from the gate toward the drain.

In some embodiments, each of the plurality of field plates may have a width less than or equal to several micrometers.

In some embodiments, the power device may further include a barrier layer on the channel layer and a depletion forming layer between the barrier layer and the gate. The barrier layer may be configured to form a two dimensional electron gas (2 DEG) in the channel layer. The depletion forming layer may be configured to form a depletion region in the 2 DEG.

In some embodiments, the channel layer may include a GaN-based material, and the barrier layer may include at least one of Al, Ga, In, and B.

In some embodiments, the depletion forming layer may include a p-type groups III-V nitride semiconductor.

According to an another embodiment, a method of manufacturing a power device may include forming a source and a drain on respective sides of a channel layer and forming a gate on the channel layer between the source and the drain; forming a passivation layer covering the source, the drain, and the gate; and forming a plurality of field plates having different thicknesses in the passivation layer. The plurality of field plates may have different widths, different pattern shapes, or both different widths and different pattern shapes.

In some embodiments, the forming the plurality of field plates may include forming a photoresist layer on the passivation layer, the photoresist layer including a plurality of etching patterns having different widths, different pattern shapes, or both different widths and different pattern shapes; forming a plurality of trenches having different depths by etching the passivation layer through the plurality of etching patterns; forming a conductive metal layer on the passivation layer to fill the plurality of trenches; and forming the plurality of field plates having different thicknesses by performing a planarization process on the conductive metal layer.

In some embodiments, the plurality of trenches may be formed by dry-etching the passivation layer.

In some embodiments, the plurality of trenches may be formed to have different depths due to microloading effects.

In some embodiments, each of the plurality of trenches may be formed to have widths of less than or equal to several micrometers.

In some embodiments, the plurality of trenches may be formed to have decreasing depths in the direction from the gate toward the drain.

In some embodiments, the forming of the plurality of field plates may include forming at least one etch stop layer in the passivation layer; forming a photoresist layer on the passivation layer, the photoresist layer including a plurality of etching patterns which have different widths, different pattern shapes, or both different widths and different pattern shapes; forming a plurality of trenches having different depths by etching the passivation layer and selectively etching the etch stop layer through the plurality of etching patterns; forming a conductive metal layer on the passivation layer, the conductive metal layer filling the plurality of trenches; performing a planarization process on the conductive metal layer to form the plurality of field plates having different thicknesses.

In some embodiments, the etching the passivation layer may be performed by dry-etching, and the selectively etching the etch stop layer may be performed by dry-etching or wet-etching.

In some embodiments, the plurality of trenches may be formed to have decreasing depths in a direction from the gate toward the drain.

In some embodiments, the method of manufacturing the power device may further include forming a barrier layer, the barrier layer configured to form a two dimensional electron gas (2 DEG) in the channel layer; and forming a depletion forming layer, the depletion forming layer configured to form a depletion region in the 2 DEG between the barrier layer and the gate.

In some embodiments, the channel layer may include a GaN-based material, and the barrier layer may include at least one of Al, Ga, In, and B.

In some embodiments, the depletion forming layer may include a p-type group III-V nitride semiconductor.

According to an embodiment, a power device may include a channel layer; a source and a drain connected to respective sides of the channel layer; a gate on the channel layer between the source and the drain; a passivation layer on the channel layer and covering the source, the drain, and the gate; and a plurality of field plates in the passivation layer. The passivation layer may define a plurality of trenches spaced apart from each other over a region of the channel layer between the gate and the drain. The plurality of trenches may have different depths from an upper surface of the passivation layer. The plurality of trenches may include a first trench and a second trench. A dimension of the first trench may be different than a dimension of the second trench. The plurality of field plates may include a first field plate in the first trench and a second field plate in the second trench.

In some embodiments, a thickness of the first field plate may be greater than a thickness of the second field plate, and a distance between the drain and the second field plate is less a distance between the drain and the first field plate in a plan view.

In some embodiments, a width of the first field plate may be greater than a width of the second field plate. The width of the first field plate and the width of the second field plate may be measured in a first direction. The gate and the drain may be spaced apart from each other in the first direction. A distance between the drain and the second field plate may be less a distance between the drain and the first field plate in a plan view.

In some embodiments, a length of the first field plate may be greater than a length of the second field plate. The length of the first field plate and the length of the second field plate may be measured in a first direction. The gate and the drain may be spaced apart from each other in a second direction. The first direction may cross the second direction. A distance between the drain and the second field plate may be less a distance between the drain and the first field plate in a plan view.

In some embodiments, the power device may further include barrier layer on the channel layer and a depletion forming layer between the barrier layer and the gate. The barrier layer may be configured to form a two dimensional electron gas (2 DEG) in the channel layer. The depletion forming layer may be configured to form a depletion region in the 2 DEG.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
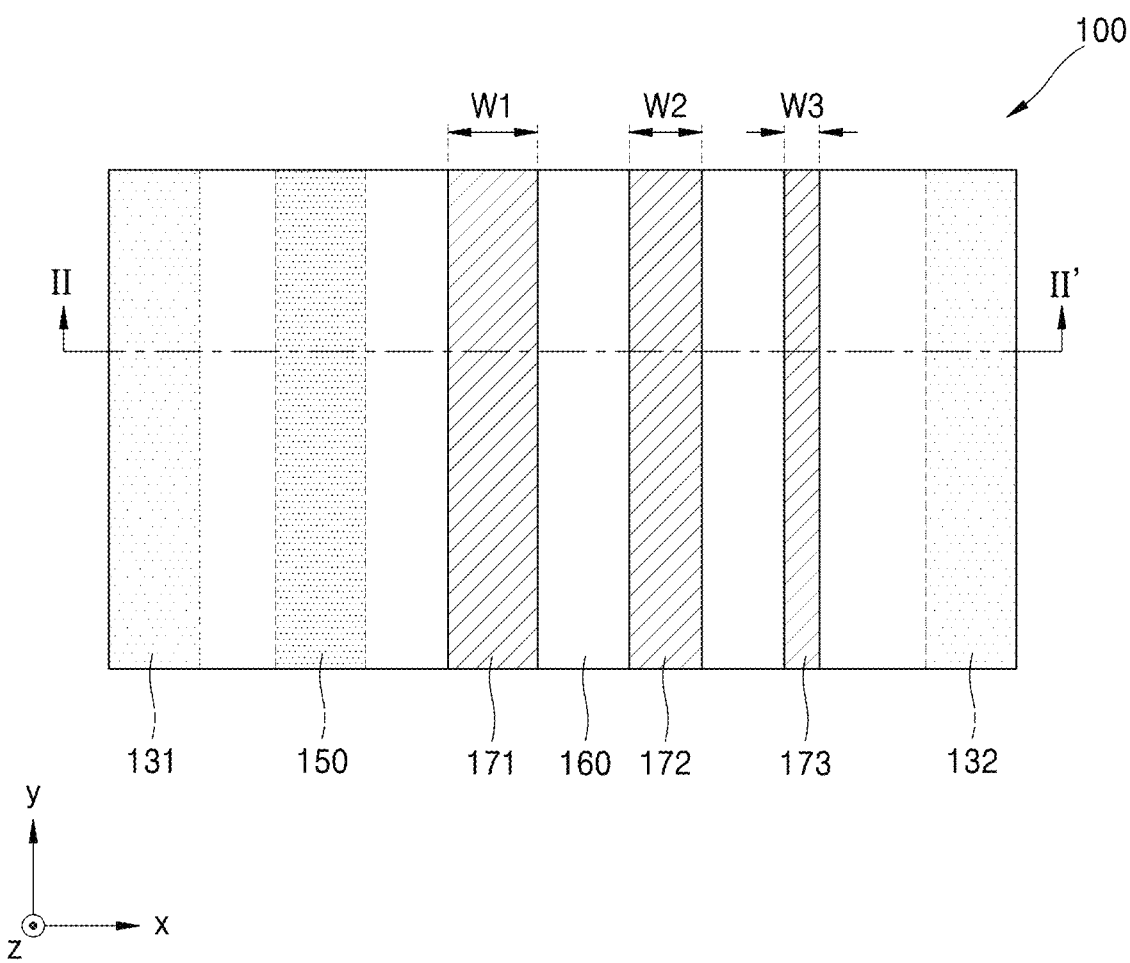
FIG. 1 is a plan view schematically illustrating a power device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

Hereinafter, example embodiments will be described in detail with reference to the accompanying drawings. Hereinafter, like reference numerals in the drawings denote like elements, and sizes of components in the drawings may be exaggerated for convenience of explanation. Meanwhile, embodiments described below are provided only as an example, and may be modified in many different forms.

When a component is referred to as "on," "on the top of," etc. another component, it shall be understood that the component not only may be directly on, under, on the left of, and on the right of another component, but also it may be on, under, on the left of, and on the right of another component in a non-contact manner. An expression used in the singular encompasses the expression of the plural, unless it has a clearly different meaning in the context. Further, when a portion "includes" an element, another element may be further included, rather than excluding the existence of the other element, unless otherwise described.

The use of the terms "a," "an" and "the" and similar referents are to be construed to cover both the singular and the plural. The operations of all methods described herein can be performed in any suitable order unless otherwise indicated herein or otherwise clearly contradicted by context. Embodiments are not limited to the described order of the operations.

In addition, the terms " . . . part," "module," etc., described in the specification refer to a unit for processing at least one function or operation, which can be implemented by a hardware or a software, or a combination of a hardware and a software.

Furthermore, the connecting lines, or connectors shown in the various figures presented are intended to represent example functional relationships and/or physical or logical couplings between the various elements. It should be noted that many alternative or additional functional relationships, physical connections or logical connections may be present in a practical device.

The use of any and all examples, or example language provided herein, is intended merely to better illuminate embodiments and does not pose a limitation on the scope of embodiments unless otherwise claimed.

In the following example embodiments, a high electron mobility transistor (HEMT) is provided as an example of a power device; however, the disclosure is not limited thereto.

The HEMT includes semiconductor layers having different electrical polarization characteristics. In the HEMT, a semiconductor layer having a relatively great polarizability may induce a two dimensional electron gas (2 DEG) in other layers, and such 2 DEG may have a very high electron mobility.

Meanwhile, in a normally-on state, in which a current flows because of a low resistance between a drain electrode and a source electrode when a gate voltage is 0V in the HEMT, consumption of current and power may occur. To change the state of a current between the drain electrode and the source electrode to an off-state, a negative voltage should be applied to the gate electrode. A depletion forming layer may be applied to solve such issue. By providing a depletion forming layer, a normally-off state in which a current between the drain electrode and the source electrode is off when the gate voltage is 0V, may be implemented.

Figure 2:
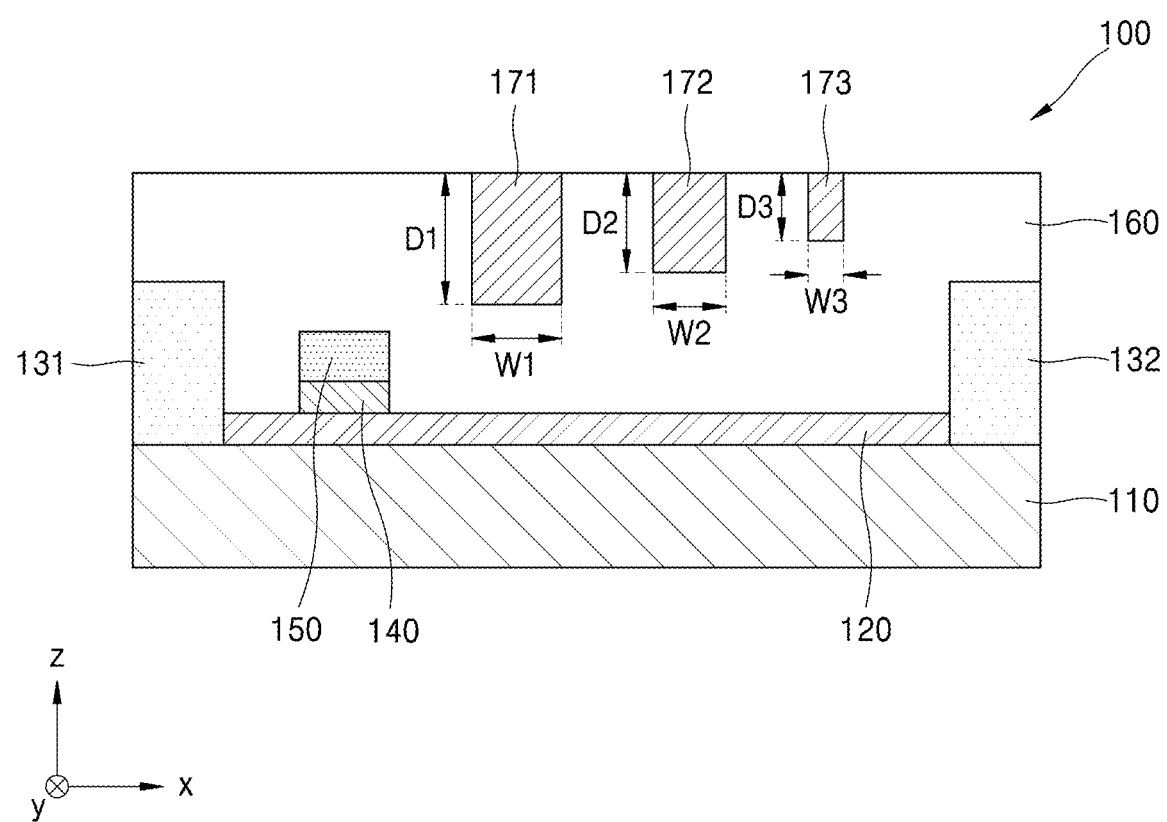
FIG. 2 is a cross-sectional view taken along the line II-II' in FIG. 1.

FIG. 1 is a plan view schematically illustrating a power device according to an example embodiment, and FIG. 2 is a cross-sectional view taken along the line II-II' in FIG. 1.

With reference to FIGS. 1 and 2, a power device 100 may include a channel layer 110, a source 131, a drain 132, a gate 150, a passivation layer 160, and a plurality of field plates 171, 172, and 173. The source 131 and the drain 132 may be provided on either side of the channel layer 110, and the gate 150 may be provided on the channel layer 110 between the source 131 and the drain 132. The passivation layer 160 may be provided to cover the source 131, the drain 132 and the gate 150, and the plurality of field plates 171, 172, and 173 may be provided in the passivation layer 160.

The channel layer 110 may be provided on a substrate (not shown). The substrate may include, for example, sapphire, Si, SiC, or GaN, etc.; however, the disclosure is not limited thereto, and the substrate may include various other materials.

The channel layer 110 may include a first semiconductor material. Here, the first semiconductor material may be groups III-V compound semiconductor materials, but the disclosure is not necessarily limited thereto. For example, the channel layer 110 may be a GaN-based material layer, such as a GaN layer for example. In some embodiments, the channel layer 110 may be an undoped GaN layer, and in some cases, the channel layer 110 may be a GaN layer doped with certain impurities.

A buffer layer (not shown) may be further provided between the channel layer 110 and the substrate. The buffer layer may be for mitigating differences in lattice constants and thermal expansion coefficients of the substrate and the channel layer 110. The buffer layer may include a nitride including at least one of Al, Ga, In, and B, and may have a single-layer or a multi-layer structure. For example, the buffer layer may include at least one of AlN, GaN, AlGaN, InGaN, AlInN, and AlGaInN. A seed layer (not shown) for growth of the buffer layer may be further provided between the substrate 110 and the buffer layer.

A barrier layer 120 may be provided on the channel layer 110. The barrier layer 120 may cause a 2 DEG in the channel layer 110. Here, the 2 DEG may be formed in the channel layer 110 under an interface of the channel layer 110 and the barrier layer 120. The barrier layer 120 may include a second semiconductor material different from the first semiconductor material constituting the channel layer 110. The second semiconductor material may differ from the first semiconductor material in at least one of polarization characteristics, energy bandgaps, and lattice constants.

The second semiconductor material may be greater than the first semiconductor material in terms of at least one of a polarizability and an energy bandgap. The barrier layer 120 may include, for example, a nitride including at least one of Al, Ga, In, and B, and may have a single-layer or a multi-layer structure. For example, the barrier layer 120 may include at least one of AlGaN, AlInN, InGaN, AlN, and AlInGaN. However, the disclosure is not limited thereto. The barrier layer 120 may be an undoped layer, but also may be a layer doped with certain impurities.

The source 131 and the drain 132 may be provided on either side of the barrier layer 120 on the channel layer 110. The source 131 and the drain 132 may be provided to extend side by side along the y-axis direction. The source 131 and the drain 132 may include, for example, a conductive material such as, Ti, Al, etc. The source 131 and the drain 132 may be electrically connected to the 2 DEG. Meanwhile, the source 131 and the drain 132 may be provided on the barrier layer 120.

A depletion forming layer 140 may be provided on the barrier layer 120 between the source 131 and the drain 132. The depletion forming layer 140 may include a p-type semiconductor material. That is, the depletion forming layer 140 may be a semiconductor layer doped with p-type impurities. The depletion forming layer 140 may include groups III-V nitride semiconductors. The depletion forming layer 140 may include, for example, at least one of GaN, AlGaN, InN, AlInN, InGaN, and AlInGaN doped with p-type impurities. For example, the depletion forming layer 140 may be a p-GaN layer.

The depletion forming layer 140 may increase an energy bandgap of the barrier layer 120 located thereunder and thus, a depletion region of the 2 DEG may be formed on a portion of the channel layer 110 corresponding to the depletion forming layer 140. Accordingly, a portion of the 2 DEG corresponding to the depletion forming layer 140 may be cut off or have different properties (e.g., electronic concentration, etc.) with the rest of the portions. The region where the 2 DEG is cut off may be referred to as a "cut off region." Due to such cut off region, a power device may have a normally-off state when a gate voltage is 0V. In a normally-off state, a current between the drain 132 and the source 131 is in off-state when a gate voltage is 0V.

The gate 150 may be provided on the depletion forming layer 140. The gate 150 may be provided to extend side by side with the source 131 and the drain 132 along the y-axis direction. The gate 150 may include a conductive material such as a metal material or a metal compound. For example, the gate 150 may include Ti, Al, TiN, TiAl, or W, but the disclosure is not limited thereto.

The passivation layer 160 may be provided on the barrier layer 120 to cover the source 131, the drain 132, and the gate 150. Here, the passivation layer 160 may be a single dielectric layer formed in an integrated manner. The passivation layer 160 may include, for example, a silicon oxide, a silicon nitride, an organic polymer, etc., but the disclosure is not limited thereto.

The plurality of field plates 171, 172, and 173 may be provided in the passivation layer 160. The plurality of field plates 171, 172, and 173 may include a conductive material such as metal. In FIGS. 1 and 2, the x-axis direction, the y-axis direction and the z-axis direction denote a width direction, a length direction, and a thickness direction of the field plates 171, 172 and 173, respectively, and the same applies below.

The plurality of field plates 171, 172, and 173 may be located in the passivation layer 160 between the gate 150 and the drain 132, and may be provided to have different widths. For example, plurality of field plates 171, 172, and 173 may be provided to have a decreasing width in the direction from the gate 150 toward the drain 132. For example, the plurality of field plates 171, 172, and 173 may have a width less than or equal to several micrometers. For example, the plurality of field plates 171, 172, and 173 may have a width less than equal to 3 μm, respectively, but the disclosure is not limited thereto.

The plurality of field plates 171, 172, and 173 may be provided to have different thicknesses in the passivation layer 160. For example, plurality of field plates 171, 172, and 173 may have a thickness which gradually decreases in a depth direction from a top surface of the passivation layer 160, along the direction from the gate 150 toward the drain 132. Accordingly, the plurality of field plates 171, 172, and 173 may be provided to have an increasing distance from the channel layer 100 in the direction from the gate 150 toward the drain 132.

The plurality of field plates 171, 172, and 173 may be provided to be electrically connected to the source 131 or to be electrically connected to the gate 150. Further, the plurality of field plates 171, 172, and 173 may be electrically connected to each other and thus, the same voltage may be applied to the plurality of field plates 171, 172, and 173, or a voltage may be applied independently to each of the plurality of field plates 171, 172, and 173.

As the plurality of field plates 171, 172, and 173 having an increasing distance from the channel layer 110 in the direction from the gate 150 toward the drain 132 are provided in the passivation layer 160, an electric field formed between the gate 150 and the drain 132 may be controlled more effectively, which may lead to an increased breakdown voltage. In addition, the plurality of field plates 171, 172, and 173 may reduce the capacitance between the gate 150 and the drain 132 because of the shielding effect, and enhance the characteristics of high power and high frequency.

FIGS. 1 and 2 illustrate an example in which the plurality of field plates 171, 172, and 173 include a first, second and third field plates 171, 172, and 173. The first, second, and third field plates 171, 172, and 173 may be provided to extend side by side along the length direction, e.g., the y-axis direction.

A width and a thickness of the first field plate 171 may be W1 and D1, respectively, a width and a thickness of the second field plate 172 may be W2(<W1) and D2(<D1), respectively, and a width and a thickness of the third field plate 173 may be W3(<W2) and D3(<D2), respectively. Here, D1, D2, and D3 represent thicknesses of the first, second, and third field plates 171, 172, and 173 in a depth direction from the top surface of the passivation layer 160. Accordingly, the first, second, and third field plates 171, 172, and 173 may be provided to have an increasing distance from the channel layer 100 in the direction from the gate 150 toward the drain 132.

As such, the first, second, and third field plates 171, 172, and 173 may be provided to have a decreasing width in the direction from the gate 150 toward the drain 132. Further, the first, second, and third field plates 171, 172, and 173 may have a thickness which gradually decreases in the depth direction from the top surface of the passivation layer 160, in the direction from the gate 150 toward the drain 132. The first, second, and third field plates 171, 172, and 173 may be formed to have different thicknesses by using microloading effects which occur during an etching process as described later.

According to the foregoing descriptions, the plurality of field plates 171, 172, and 173 include three field plates; however, such descriptions are provided merely as an example, and the plurality of field plates 171, 172, and 173 may include two or four or more field plates.

Figure 3:
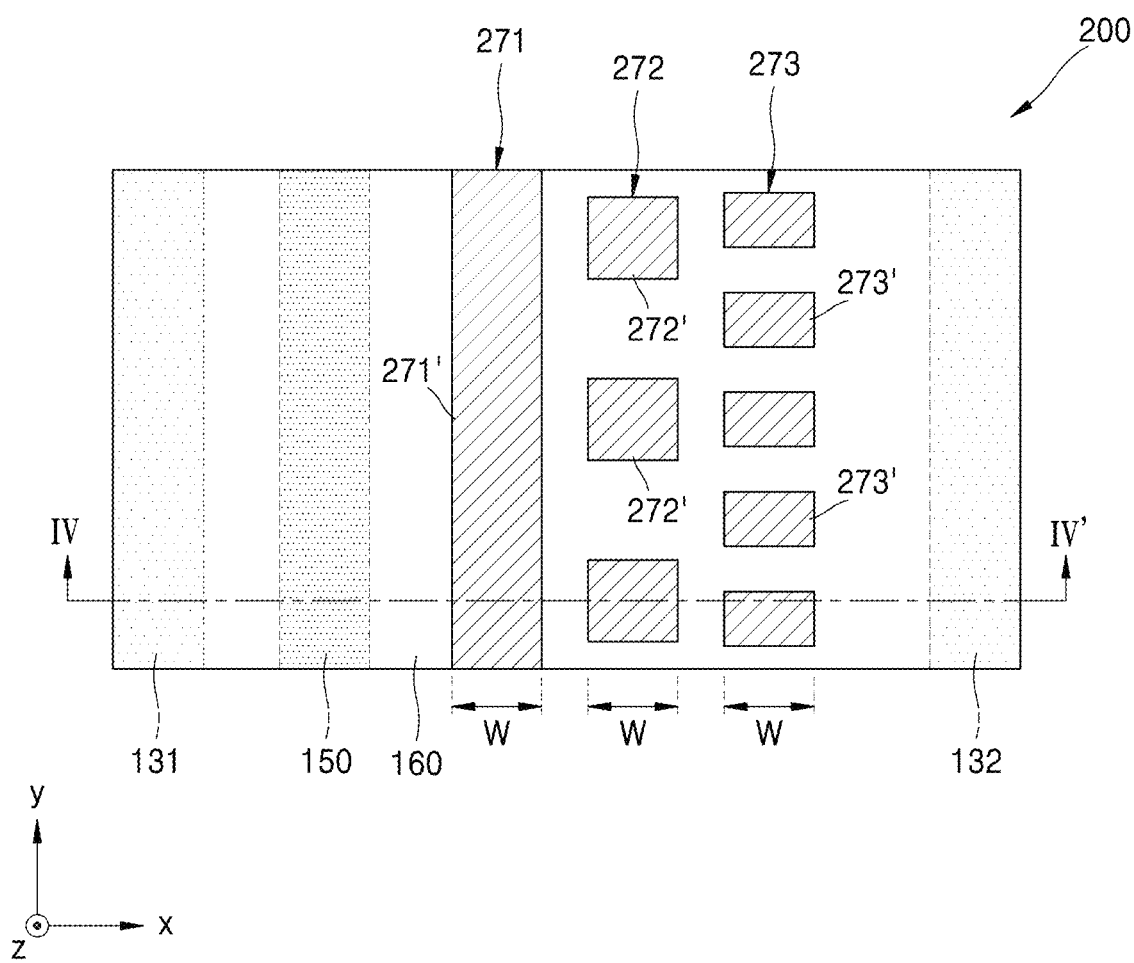
FIG. 3 is a plan view schematically illustrating a power device according to another example embodiment.
Figure 4:
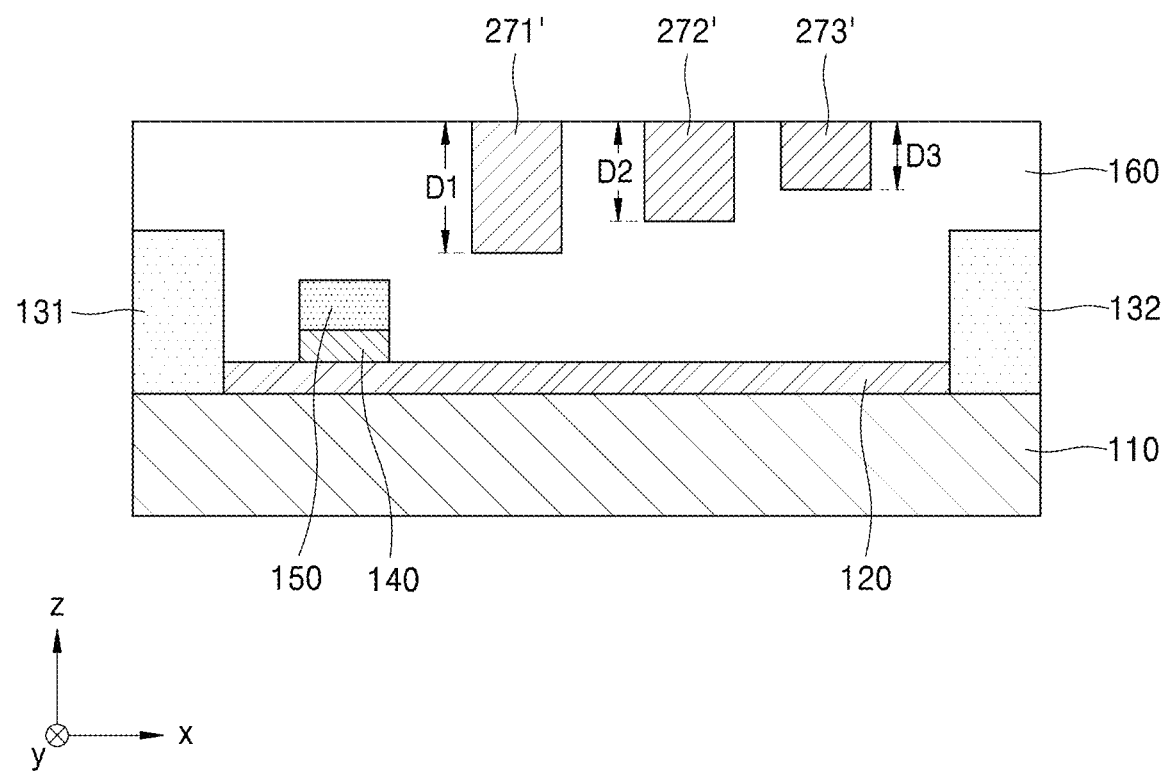
FIG. 4 is a cross-sectional view taken along the line IV-IV' in FIG. 3.

FIG. 3 is a plan view schematically illustrating a power device according to another example embodiment, and FIG. 4 is a cross-sectional view taken along the line IV-IV' in FIG. 3. A power device 200 of FIGS. 3 and 4 is similar to the power device 100 of FIGS. 1 and 2 except for the widths of a first, second, and third field plates 271, 272, and 273 and shapes of patterns.

With reference to FIGS. 3 and 4, the first, second, and third field plates 271, 272, and 273 may be provided to have the same width W. The first, second, and third field plates 271, 272, and 273 may have a width less than or equal to several micrometers. For example, the first, second, and third field plates 271, 272, and 273 may have a width less than equal to 3 μm, respectively, but the disclosure is not limited thereto.

The first, second, and third field plates 271, 272, and 273 may be provided to have different pattern shapes. For example, first, second, and third field plates 271, 272, and 273 may each include at least one subplate. For example, the first field plate 271 may include one first subplate 271', which is formed in an integrated manner, the second field plate 272 may include a plurality of second subplates 272' spaced apart from each other, and the third field plate 273 may include a plurality of third subplates 273' spaced apart from each other. Here, the second subplate 272' may have a size smaller than that of the first subplate 271', and the third subplate 273' may have a size smaller than that of the second subplate 272'. The plurality of second subplates 272' may be electrically connected to each other, and the plurality of third subplates 273' may be electrically connected to each other. Further, the first, second, and third field plates 271, 272, and 273 may be electrically connected to each other.

FIGS. 3 and FIG. 4 illustrate an example in which the first field plate 271 includes the first subplate 271', which is formed in an integrated manner, but the disclosure is not limited thereto, and the first field plate 271 may include a plurality of first subplates (not shown). Further, the form of the first, second, and third subplates 271', 272', and 273' may be modified in various ways.

The first, second, and third field plates 271, 272, and 273 may be provided to have different thicknesses D1, D2, and D3 in the passivation layer 160. For example, the first, second, and third field plates 271, 272, and 273 may have thicknesses that decrease in the depth direction from the top surface of the passivation layer 160, in the direction from the gate 150 toward the drain 132. Accordingly, the first, second, and third field plates 271, 272, and 273 may be provided to have an increasing distance from the channel layer 100 in the direction from the gate 150 toward the drain 132.

Figure 5:
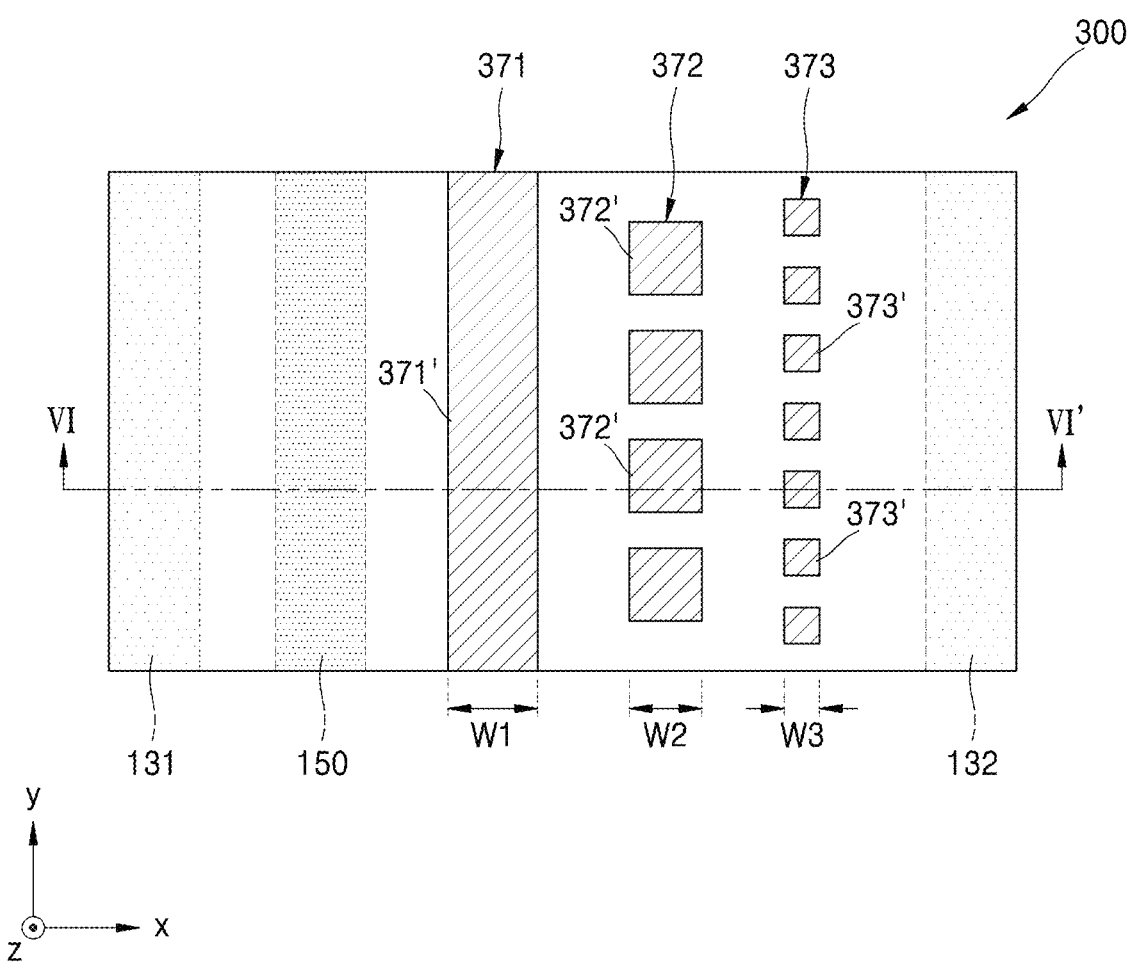
FIG. 5 is a plan view schematically illustrating a power device according to another example embodiment.
Figure 6:
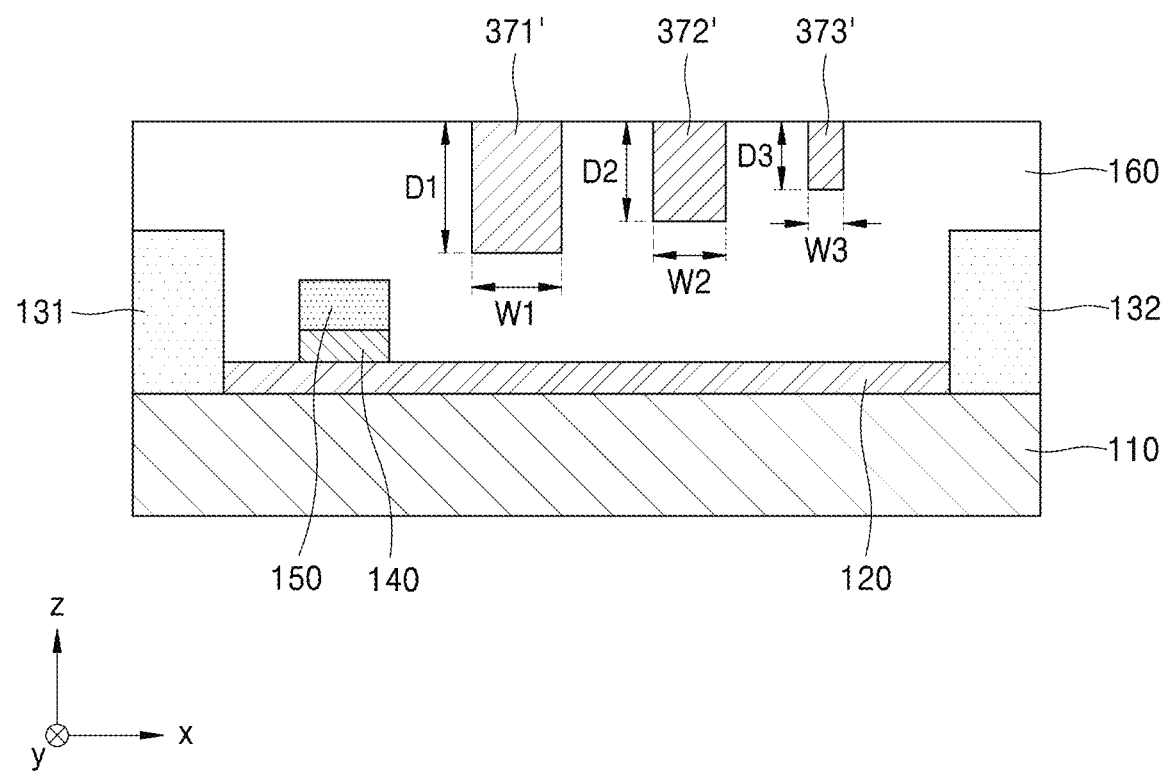
FIG. 6 is a cross-sectional view taken along the line VI-VI' in FIG. 5.

FIG. 5 is a plan view schematically illustrating a power device according to another example embodiment, and FIG. 6 is a cross-sectional view taken along the line VI-VI' in FIG. 5. A power device of FIGS. 5 and 6 is similar to the power device of FIGS. 1 and 2 except for pattern shapes of a first, second, and third field plates 371, 372, and 373.

With reference to FIGS. 5 and 6, the first, second, and third field plates 371, 372, and 373 may be provided to have a decreasing width W1, W2, and W3 in the direction from the gate 150 toward the drain 132. The first, second, and third field plates 371, 372, and 373 may have a width less than or equal to several micrometers (e.g., less than or equal to 3 μm).

The first, second, and third field plates 371, 372, and 373 may be provided to have different pattern shapes. For example, first, second, and third field plates 371, 372, and 373 may each include at least one subplate 371', 372', and 373'. For example, the first field plate 371 may include one first subplate 371', which is formed in an integrated manner, the second field plate 372 may include a plurality of second subplates 372' spaced apart from each other, and the third field plate 373 may include a plurality of third subplates 373' spaced apart from each other. Here, the second subplate 372' may have a size smaller than that of the first subplate 371', and the third subplate 373' may have a size smaller than that of the second subplate 372'. The plurality of second subplates 372' may be electrically connected to each other, and the plurality of third subplates 373' may be electrically connected to each other. Further, the first, second, and third field plates 371, 372, and 373 may be electrically connected to each other.

FIGS. 5 and FIG. 6 illustrate an example in which the first field plate 371 includes one first subplate 371' which is formed in an integrated manner, but the disclosure is not limited thereto, and the first field plate 371 may include a plurality of first subplates (not shown). Further, the form of the first, second, and third sub plates 371', 372', and 373' may be modified in various ways.

The first, second, and third field plates 371, 372, and 373 may be provided to have different thicknesses D1, D2, and D3 in the passivation layer 160. For example, first, second, and third field plates 371, 372, and 373 may have a thickness which decreases in the depth direction from the top surface of the passivation layer 160, in the direction from the gate 150 toward the drain 132. Accordingly, the first, second, and third field plates 371, 372, and 373 may be provided to have an increasing distance from the channel layer 100 in the direction from the gate 150 toward the drain 132.

FIGS. 7 to 10 are diagrams for explaining a method of manufacturing a power device according to an example embodiment. Here, a case where a plurality of field plates include three field plates, e.g., a first, second, and third field plates is described as an example.

Figure 7:
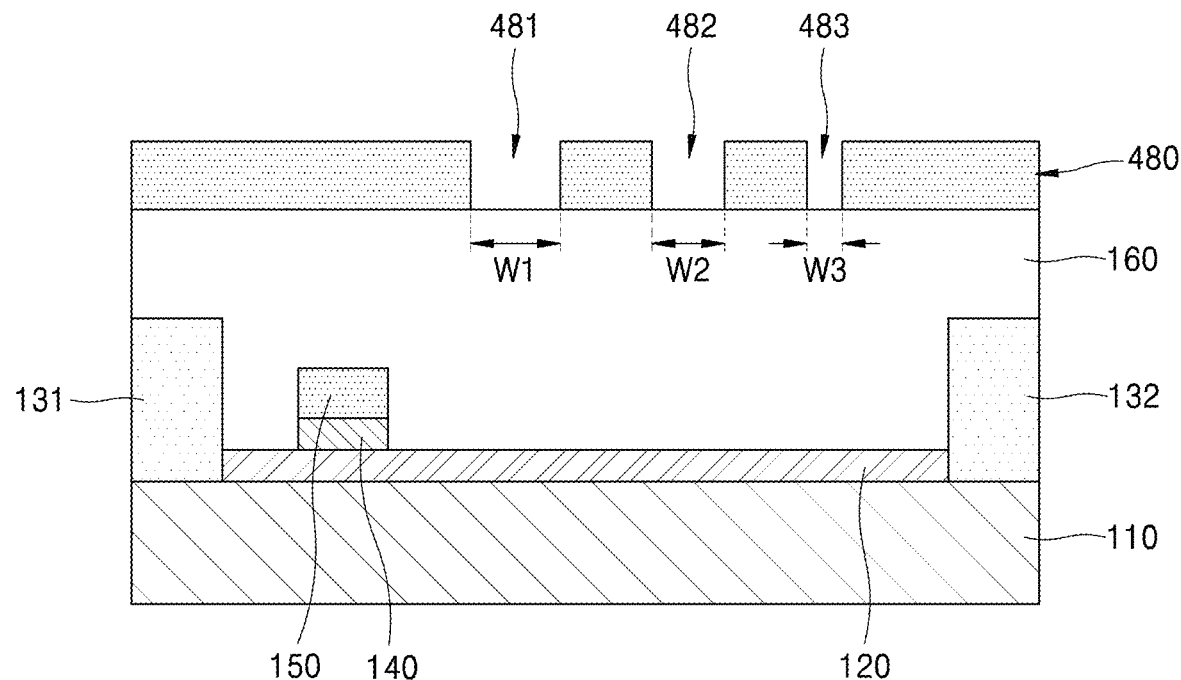
FIGS. 7 to 10 are diagrams for explaining a method of manufacturing a power device according to an example embodiment.

With reference to FIG. 7, the barrier layer 120 may be formed on the channel layer 110, and the source 131 and the drain 132 may be formed on either side of the channel layer 110. The channel layer 110 may be provided on a substrate (not shown). The substrate may include, for example, sapphire, Si, SiC, or GaN, etc.; however, the disclosure is not limited thereto, and the substrate may include various other materials.

The channel layer 110 may include a first semiconductor material. Here, the first semiconductor material may be a group III-V compound semiconductor material, but the disclosure is not necessarily limited thereto. For example, the channel layer 110 may be a GaN-based material layer, such as a GaN layer for example. In some embodiments, the channel layer 110 may be an undoped GaN layer, and in some cases, the channel layer 110 may be a GaN layer doped with certain impurities.

A buffer layer (not shown) may be further formed between the channel layer 110 and the substrate. The buffer layer may include a nitride including at least one of Al, Ga, In, and B, and may have a single-layer or a multi-layer structure. For example, the buffer layer may include at least one of AlN, GaN, AlGaN, InGaN, AlInN, and AlGaInN. A seed layer (not shown) for development of the buffer layer may be further formed between the substrate 110 and the buffer layer.

The barrier layer 120 formed on the channel layer 110 may include a second semiconductor material different from the first semiconductor material constituting the channel layer 110. The second semiconductor material may differ from the first semiconductor material in at least one of polarization characteristics, energy bandgaps, and lattice constants. The barrier layer 120 may include, for example, a nitride including at least one of Al, Ga, In, and B, and may have a single-layer or a multi-layer structure. For example, the barrier layer 120 may include at least one of AlGaN, AlInN, InGaN, AlN, and AlInGaN. However, the disclosure is not limited thereto. The barrier layer 120 may be an undoped layer, but also may be a layer doped with certain impurities. The source 131 and the drain 132 formed on either side of the channel layer 110 may include a conductive material such as, Ti, Al, etc.

The depletion forming layer 140 may be formed on the barrier layer 120 between the source 131 and the drain 132. The depletion forming layer 140 may include a p-type semiconductor material. The depletion forming layer 140 may include groups III-V nitride semiconductors. The depletion forming layer 140 may include, for example, a material which is at least one of GaN, AlGaN, InN, AlInN, InGaN, and AlInGaN doped with p-type impurities. For example, the depletion forming layer 140 may be a p-GaN layer. The gate 150 may be formed on the depletion forming layer 140. The gate 150 may include a conductive material such as a metal material or a metal compound. For example, the gate 150 may include Ti, Al, TiN, TiAl, or W, but the disclosure is not limited thereto.

The passivation layer 160 may be formed on the barrier layer 120 to cover the source 131, the drain 132, and the gate 150. Here, the passivation layer 160 may be a single dielectric layer formed in an integrated manner. The passivation layer 160 may include, for example, a silicon oxide, a silicon nitride, an organic polymer, etc., but the disclosure is not limited thereto.

A photoresist layer including a first, second, and third etching patterns 481, 482, and 483 may be formed on the top surface of the passivation layer 160 using a photolithography process.

The first, second, and third etching patterns 481, 482, and 483 may have a shape corresponding to the first, second, and third field plates 171, 172, and 173 shown in FIG. 1. Accordingly, the first, second, and third etching patterns 481, 482, and 483 may have a width which decreases in the direction from the gate 150 toward the drain 132. For example, first etching pattern 481 may have a width W1, the second etching pattern 482 may have a width W2(<W1), and the third etching pattern 483 may have a width W3(<W2). For example, the first, second, and third etching patterns 481, 482, and 483 may have a width less than or equal to several micrometers, respectively. For example, the first, second, and third etching patterns 481, 482, and 483 may have a width less than equal to 3 μm, respectively, but the disclosure is not limited thereto.

Figure 8:
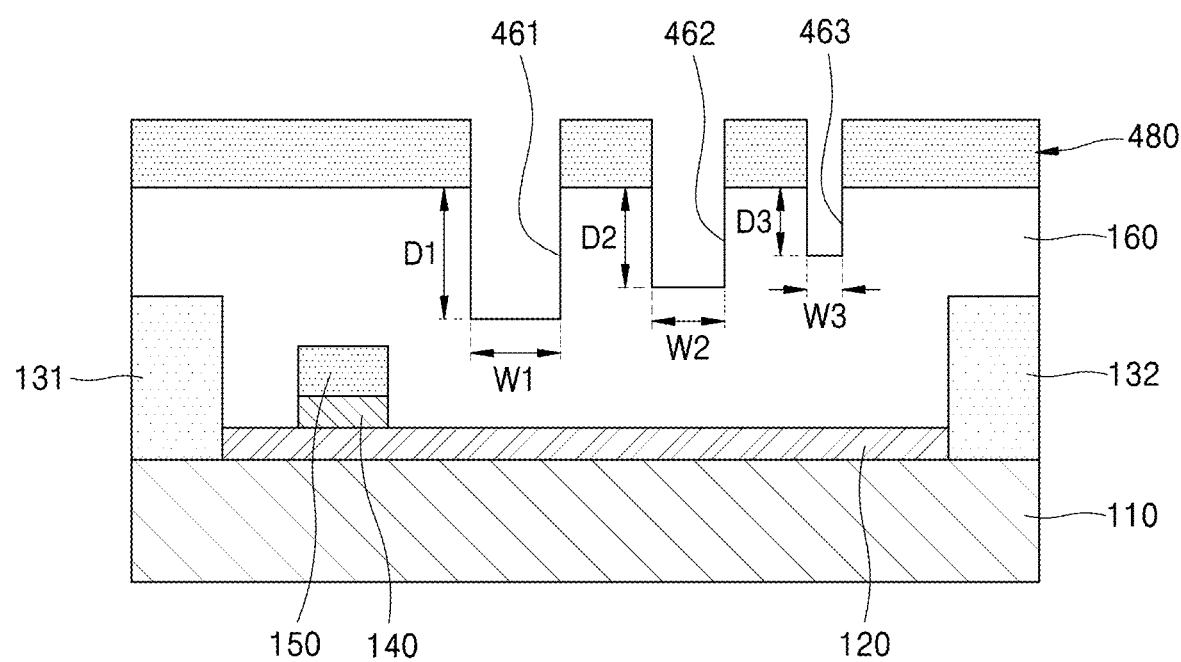

With reference to FIG. 8, a first, second, and third trenches 461, 462, and 463 may be formed by etching the passivation layer 160 exposed through the first, second, and third etching patterns 481, 482, and 483 to a certain depth. Here, the first, second, and third trenches 461, 462, and 463 may be formed by anisotropic etching the passivation layer by using a dry-etching process. The first, second, and third trenches 461, 462, and 463 may be formed to have a width and depth which decrease in the direction from the gate 150 toward the drain 132. For example, first trench 461 may be formed to have a width W1 and a depth D1 by the first etching pattern 481, the second trench 462 may be formed to have a width W2 and a depth D2(<D1) by the second etching pattern 482, and the third trench 463 may be formed to have a width W3 and a depth D3(<D2) by the third etching pattern 483. The first, second, and third trenches 461, 462, and 463 having different depths may be formed by using microloading effects which occur during an etching process. The photoresist layer 480 remaining on the top surface of the passivation layer 160 may be removed.

Figure 9:
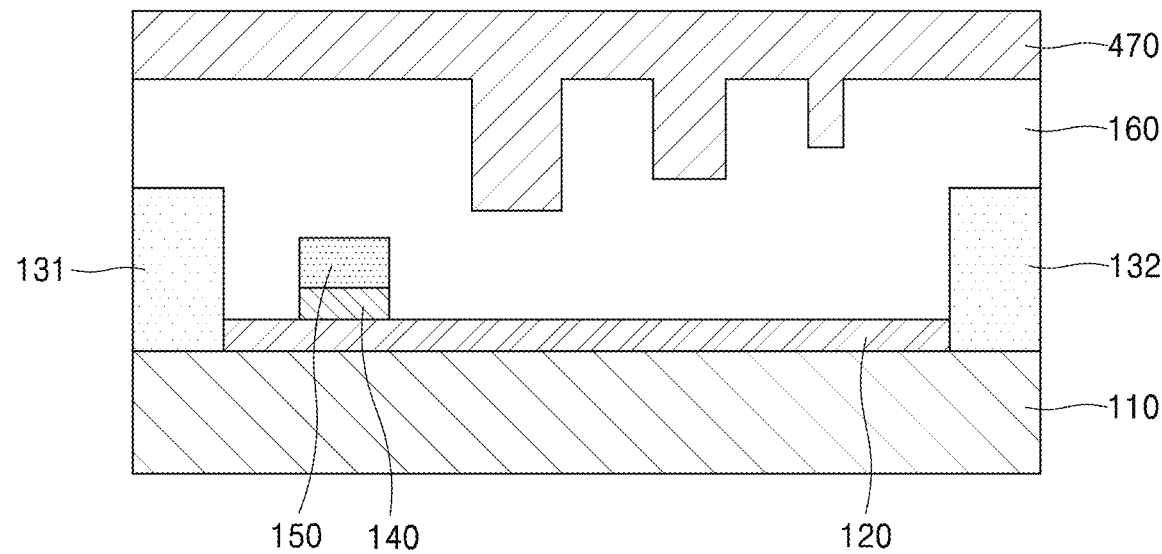
Figure 10:
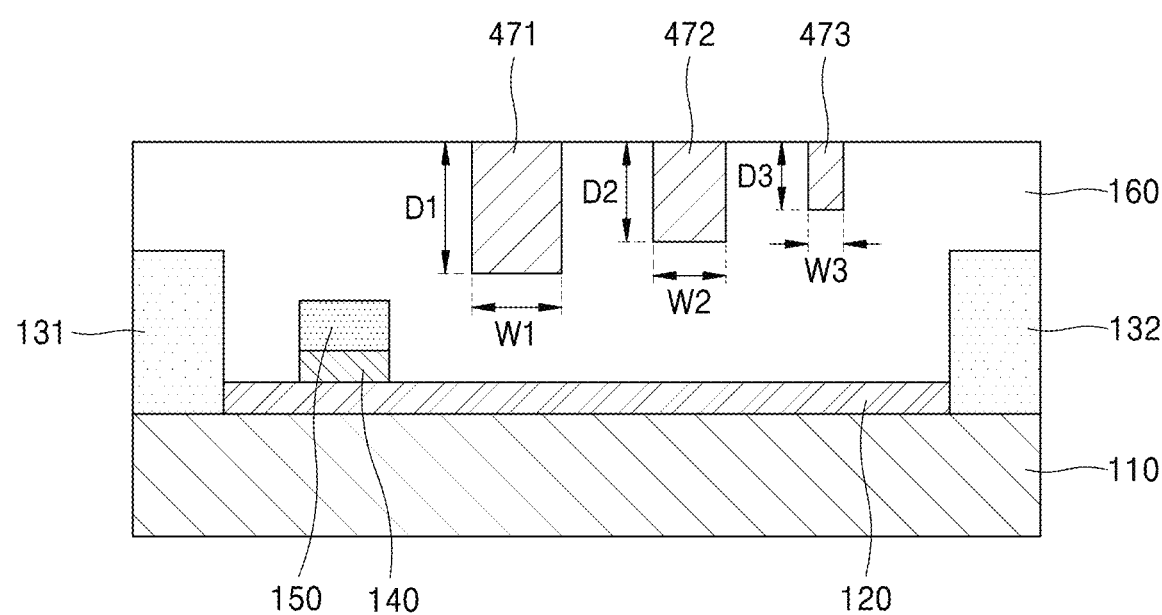

With reference to FIG. 9, a conductive metal layer 470 may be formed on the top surface of the passivation layer 160 to fill the first, second, and third trenches 461, 462, and 463. With reference to FIG. 10, the first, second, and third field plates 471, 472, and 473 may be formed in the first, second, and third trenches 461, 462, and 463 by performing a planarization process, for example, a chemical mechanical planarization (CMP) process to the conductive metal layer 470.

The first, second, and third field plates 471, 472, and 473 may be formed to have a width and depth which decrease in the direction from the gate 150 toward the drain 132. For example, first field plate 471 may be formed to have a width W1 and a depth D1, the second field plate 472 may be formed to have a width W2 width and a depth D2, and the third field plate 473 may be formed to have a width W3 and a depth D3. Here, the widths W1, W2, and W3 of the first, second, and third field plates 471, 472, and 473 may refer to pattern sizes or critical dimensions (CDs) of the first, second, and third field plates 471, 472, and 473.

As such, a case where the first, second, and third etching patterns 481, 482, and 483 have a shape each corresponding to the first, second, and third field plates 171, 172, and 173 shown in FIG. 1 is described above. However, the disclosure is not limited thereto, and the first, second, and third etching patterns 481, 482, and 483 may have a shape each corresponding to the first, second, and third field plates 271, 272, and 273 of FIG. 3, or to the first, second, and third field plates 371, 372, and 373 of FIG. 5. When the first, second, and third etching patterns 481, 482, and 483 have a shape each corresponding to the first, second, and third field plates 271, 272, and 273 of FIG. 3, the first, second, and third field plates 271, 272, and 273 of FIGS. 3 and 4 may be formed. Further, when the first, second, and third etching patterns 481, 482, and 483 have a shape each corresponding to the first, second, and third field plates 371, 372, and 373 of FIG. 5, the first, second, and third field plates 371, 372, and 373 of FIGS. 5 and 6 may be formed.

FIGS. 11 to 16 are diagrams for explaining a method of manufacturing a power device according to another example embodiment. Here, a case where a plurality of field plates include two field plates, e.g., first and second field plates is described as an example. Hereinafter, differences from the above-described embodiments will be provided mainly.

Figure 11:
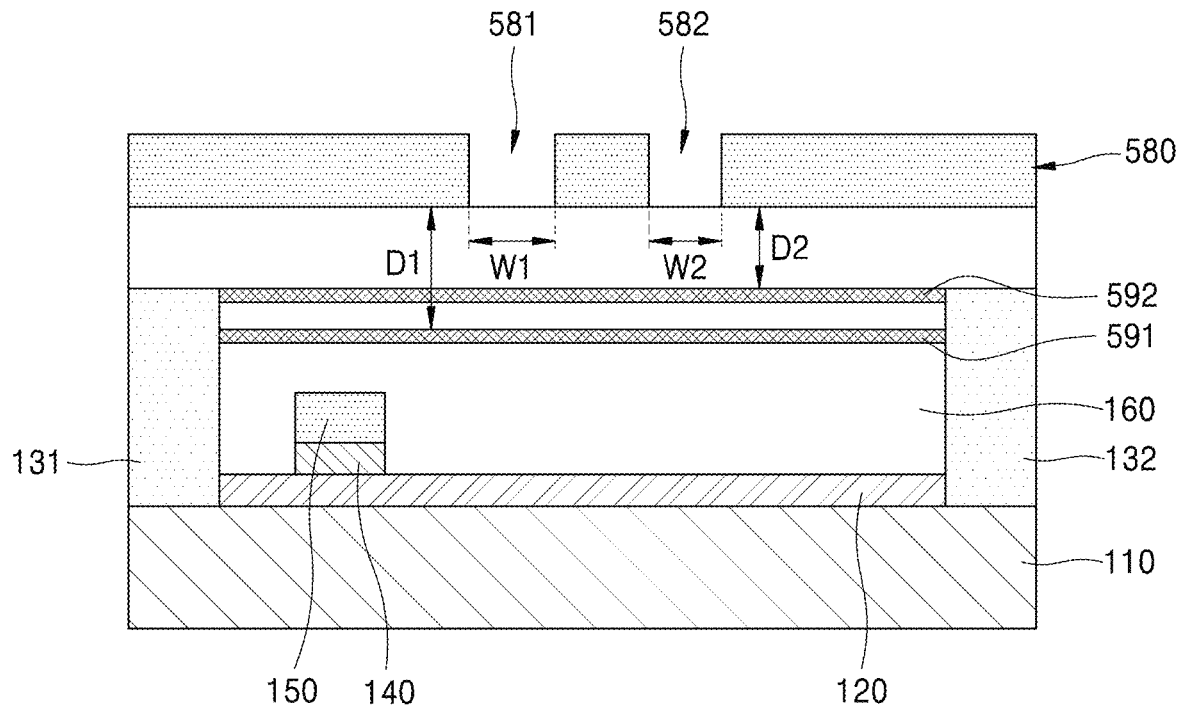
FIGS. 11 to 16 are diagrams for explaining a method of manufacturing a power device according to another example embodiment.

With reference to FIG. 11, the passivation layer 160 may be formed on the barrier layer 120 to cover the source 131, the drain 132, and the gate 150. Here, in the passivation layer 160, a first and second etch stop layers 591 and 592 may be formed to be spaced apart from each other. A top surface of the first etch stop layer 591 may be formed at a depth D1 from the top surface of the passivation layer 160, and a top surface of the second etch stop layer 592 may be formed at a depth D2(<D1) from the top surface of the passivation layer 160.

The first and second etch stop layers 591 and 592 may include a material having etch selectivity with respect to the passivation layer 160. For example, when the passivation layer 160 includes a silicon oxide, the first and second etch stop layers 591 and 592 may include a silicon nitride. However, this is only an example.

A photoresist layer 580 including a first and second etching patterns 581 and 582 may be formed on the top surface of the passivation layer 160. The first etching pattern 581 may have a width W1, and the second etching pattern 582 may have a width W2(<W1).

Figure 12:
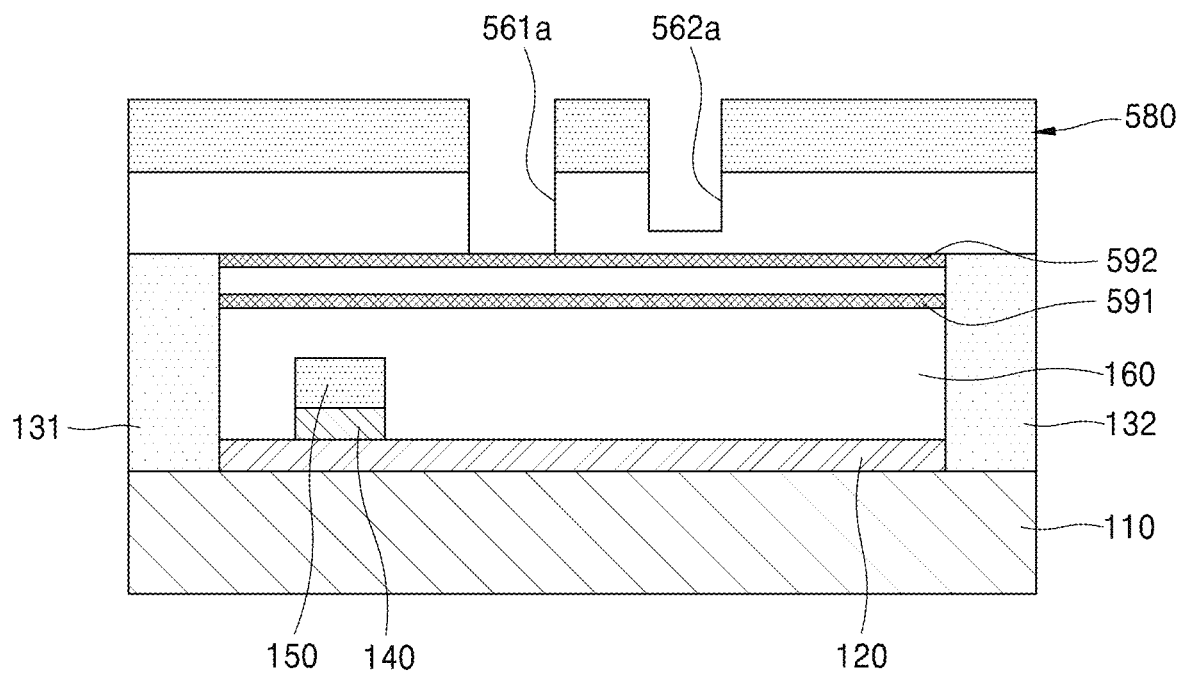

With reference to FIG. 12, a first and second pre-trenches 561a and 562a may be formed by dry-etching the passivation layer 160 exposed through the first and second etching patterns 581 and 582. Such etching process may be performed until the first pre-trench 561a exposes the second etch stop layer 592. Here, the second pre-trench 562a may be formed to have a depth less than the first pre-trench 561a.

Figure 13:
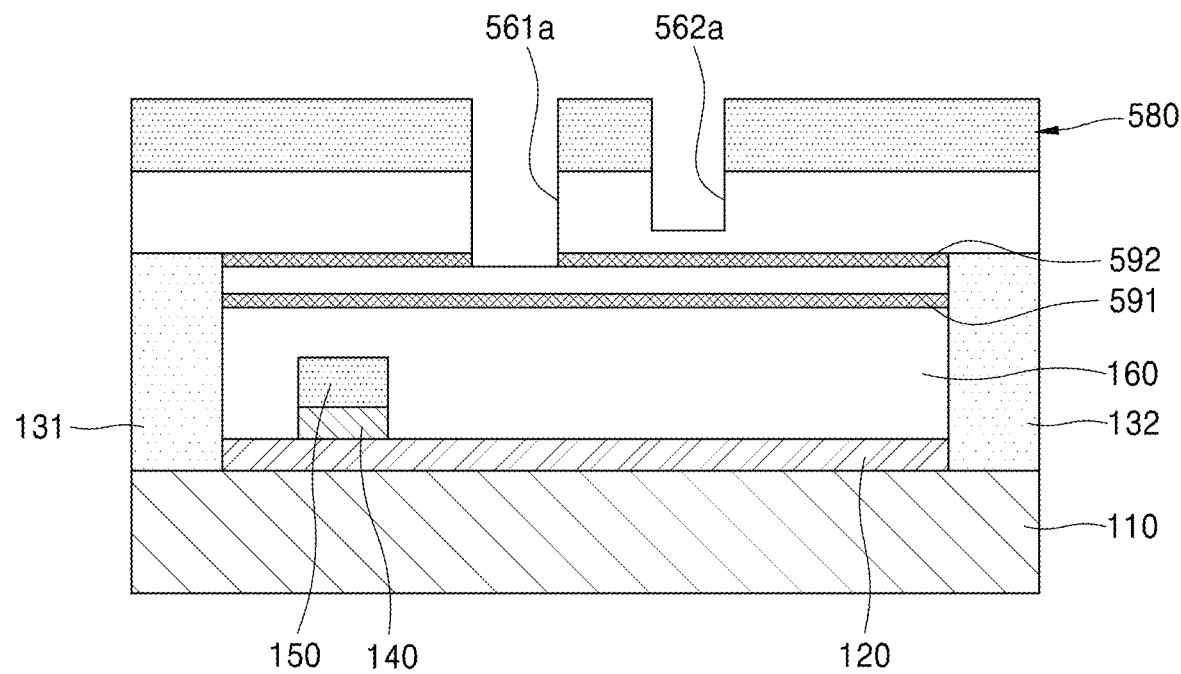

With reference to FIG. 13, only the second etch stop layer 592 exposed through the first pre-trench 561a may be selectively etched. For example, when the passivation layer 160 includes a silicon oxide, and the second etch stop layer 592 includes a silicon nitride, the second etch layer 592 may be selectively etched through the first pre-trench 561a by using phosphoric acid ($H_3PO_4$) as an etchant. Accordingly, the depth of the first pre-trench 561a may increase by the thickness of the second etch stop layer 592, and through the first pre-trench 561a, the passivation layer 160 below the second etch stop layer 592 may be exposed. In this process, the depth of the second pre-trench 562a does not change.

As such, a case where the second etch stop layer 592 is selectively etched by a wet-etching method is described; however, the disclosure is not limited thereto, and the second etch stop layer 592 may also be selectively etched using a dry-etching method.

Figure 14:
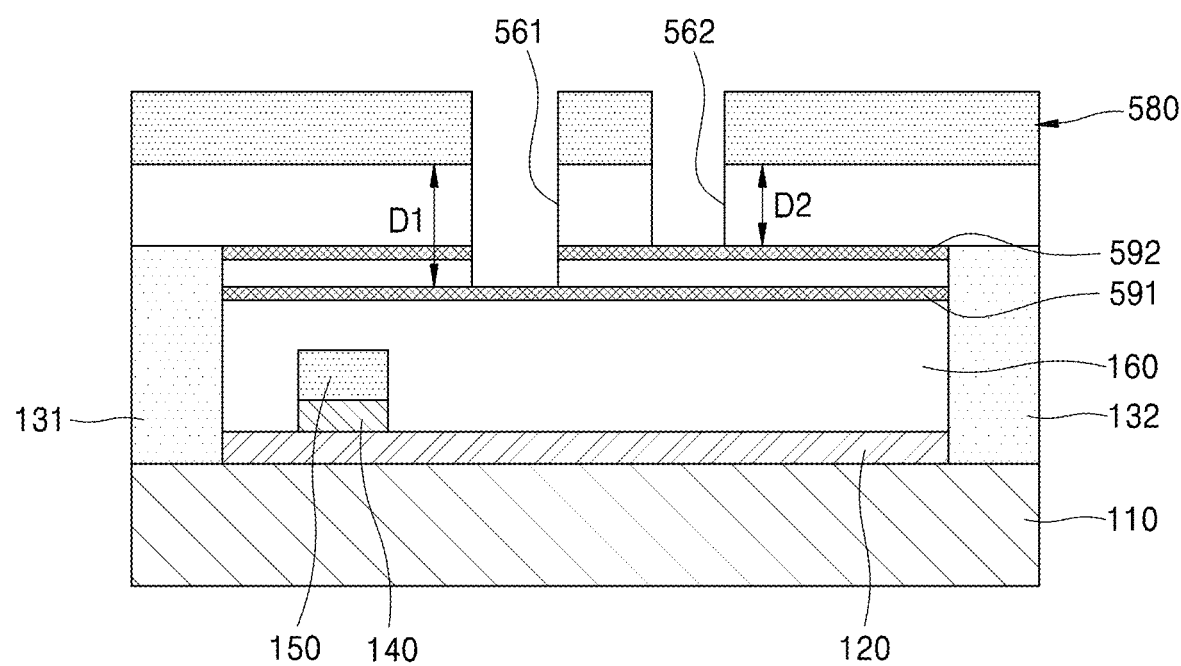

With reference to FIG. 14, the first and second trenches 561 and 562 may be formed by dry-etching the passivation layer 160 exposed through the first and second pre-trenches 561a and 562a. Such etching process may be performed until the first trench 561 exposes the first etch stop layer 591 and the second trench 562 exposes the second etch stop layer 592. Accordingly, the first trench 561 may be formed at a depth D1, and the second trench 562 may be formed at a depth D2. Then, the first and second trenches 561 and 562 may be formed to have a width W1 and a width W2, respectively. The photoresist layer 580 remaining on the top surface of the passivation layer 160 may be removed.

Figure 15:
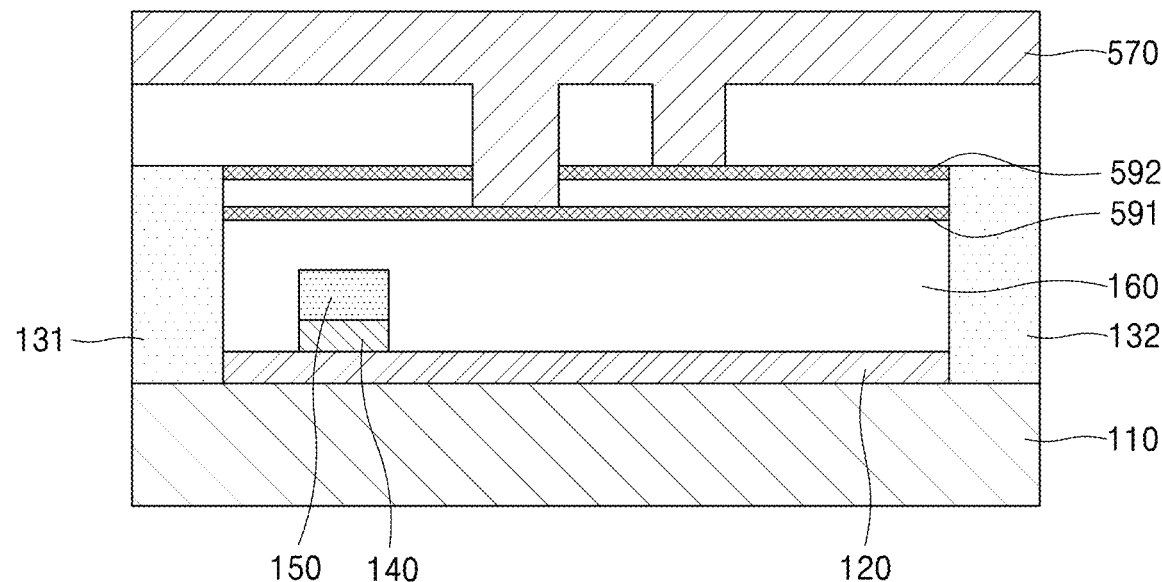
Figure 16:
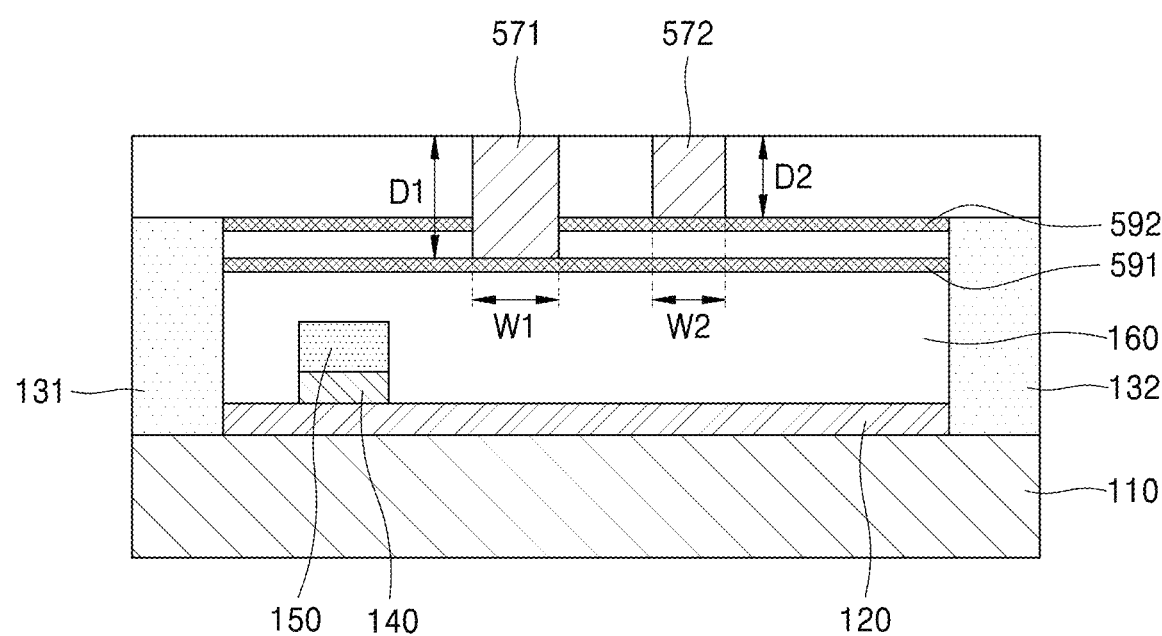

With reference to FIG. 15, a conductive metal layer 570 may be formed on the top surface of the passivation layer 160 to fill the first and second trenches 561 and 562. With reference to FIG. 16, first and second field plates 571 and 572 may be formed in the first and second trenches 561 and 562 by performing a planarization process (e.g., CMP process) to the conductive metal layer 570.

The first and second field plates 571 and 572 may be formed to have a thickness which decreases in the direction from the gate 150 toward the drain 132. In this embodiment, the first and second field plates 571 and 572 may be formed at a more accurate depth by providing the first and second etch stop layers 591 and 592 in the passivation layer 160. The above-described first and second etching patterns 581 and 582 may have a shape each corresponding to the field plates shown in FIG. 3 or have a shape each corresponding to the field plates shown in FIG. 5.

FIGS. 17 to 21 are diagrams for explaining a method of manufacturing a power device according to another example embodiment. Here, a case where a plurality of field plates include two field plates, e.g., first and second field plates is described as an example. Hereinafter, differences from the above-described embodiments will be provided mainly.

Figure 17:
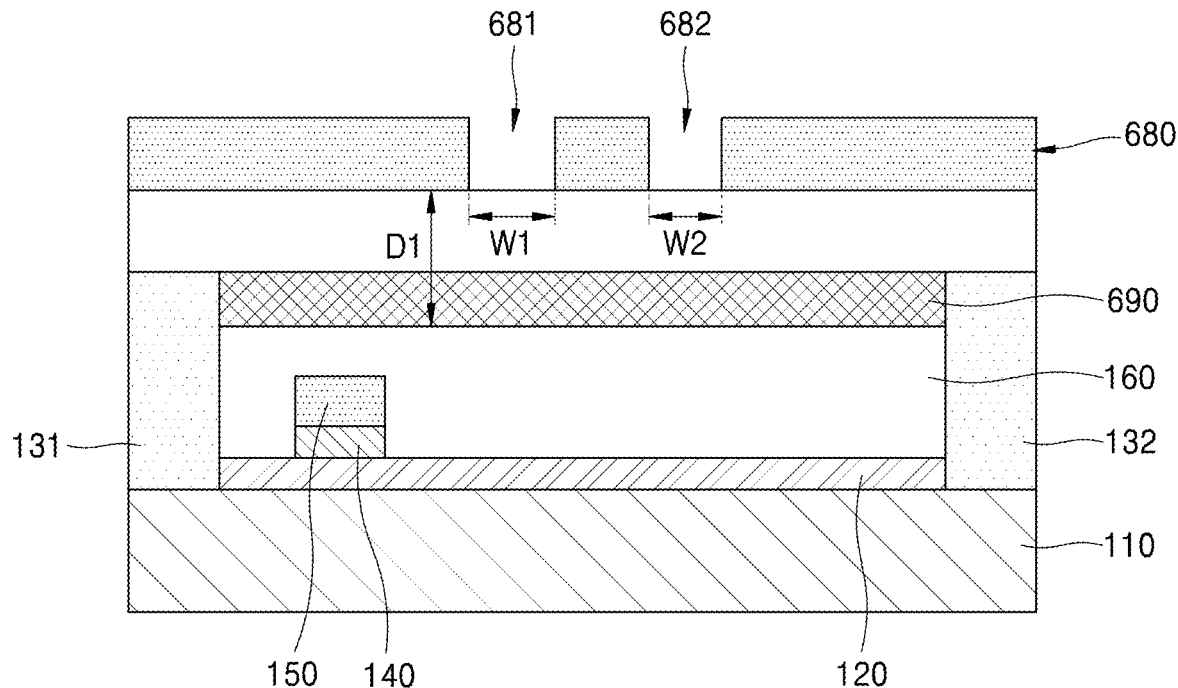
FIGS. 17 to 21 are diagrams for explaining a method of manufacturing a power device according to another example embodiment.

With reference to FIG. 17, the passivation layer 160 may be formed on the barrier layer 120 to cover the source 131, the drain 132, and the gate 150. Here, an etch stop layer 690 may be formed in the passivation layer 160. Here, a bottom surface of the etch stop layer 690 may be formed at a depth D1 from a top surface of the passivation layer 160. The etch stop layer 690 may include a material having etch selectivity with respect to the passivation layer 160.

A photoresist layer 680 including a first and second etching patterns 681 and 682 may be formed on the top surface of the passivation layer 160. The first etching pattern 681 may have a width W1, and the second etching pattern 682 may have a width W2(<W1).

Figure 18:
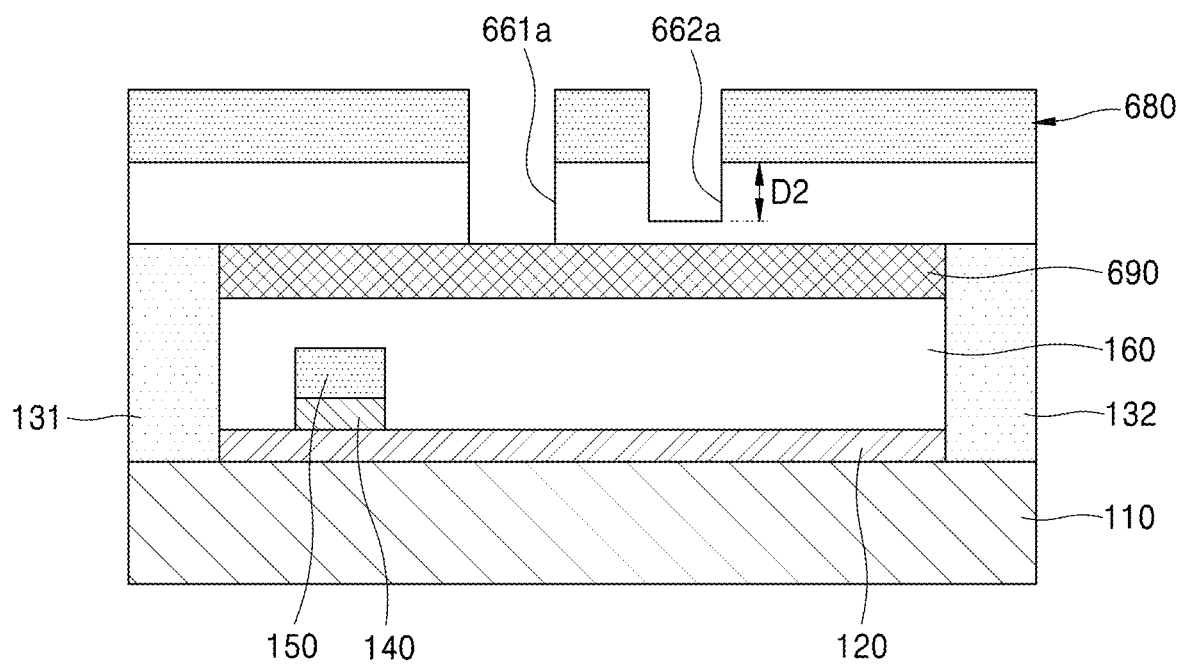

With reference to FIG. 18, first and second pre-trenches 661a and 662a may be formed by dry-etching the passivation layer 160 exposed through the first and second etching patterns 681 and 682. Such etching process may be performed until the first pre-trench 661a exposes the etch stop layer 690. Here, the second pre-trench 662a may be formed to have a depth D2 less than the first pre-trench 661a.

Figure 19:
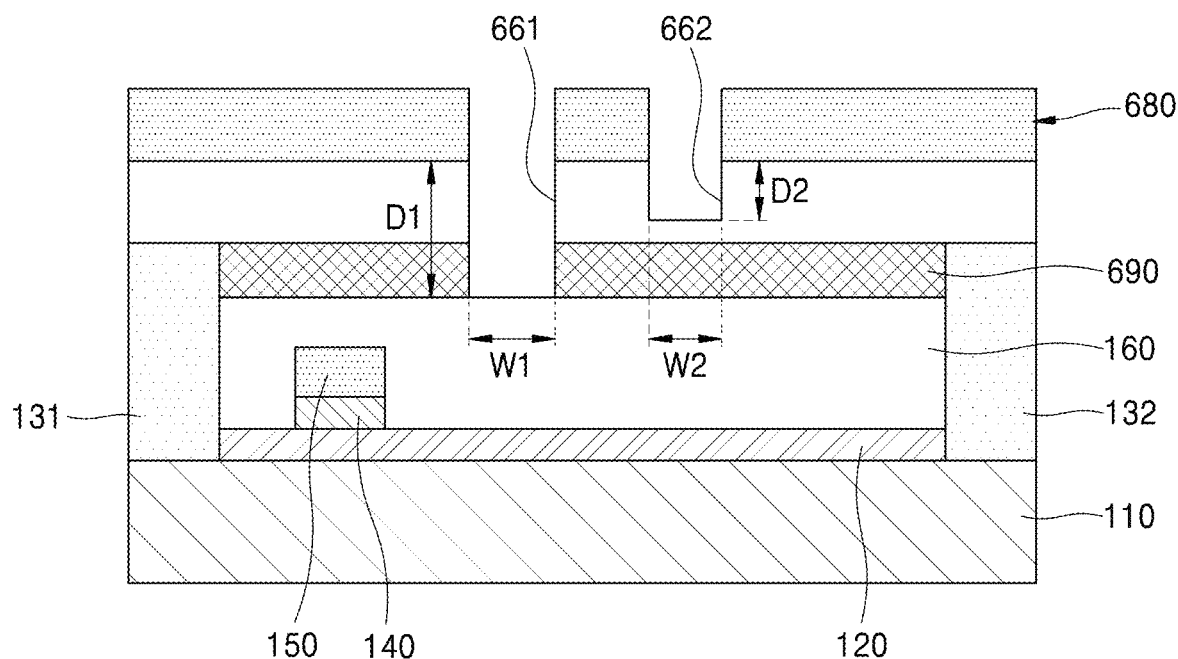

With reference to FIG. 19, only the etch stop layer 690 exposed through the first pre-trench 661a may be selectively etched. Such selective etching of the etch stop layer 690 may be performed by wet-etching or dry-etching. Accordingly, the first trench 661 may be formed at a depth D1, and the second trench 662 may be formed at a depth D2 which is identical to the depth of the second pre-trench 662a. Then, the first and second trenches 661 and 662 may be formed to have a width W1 and a width W2, respectively. The photoresist layer 680 remaining on the top surface of the passivation layer 160 may be removed.

Figure 20:
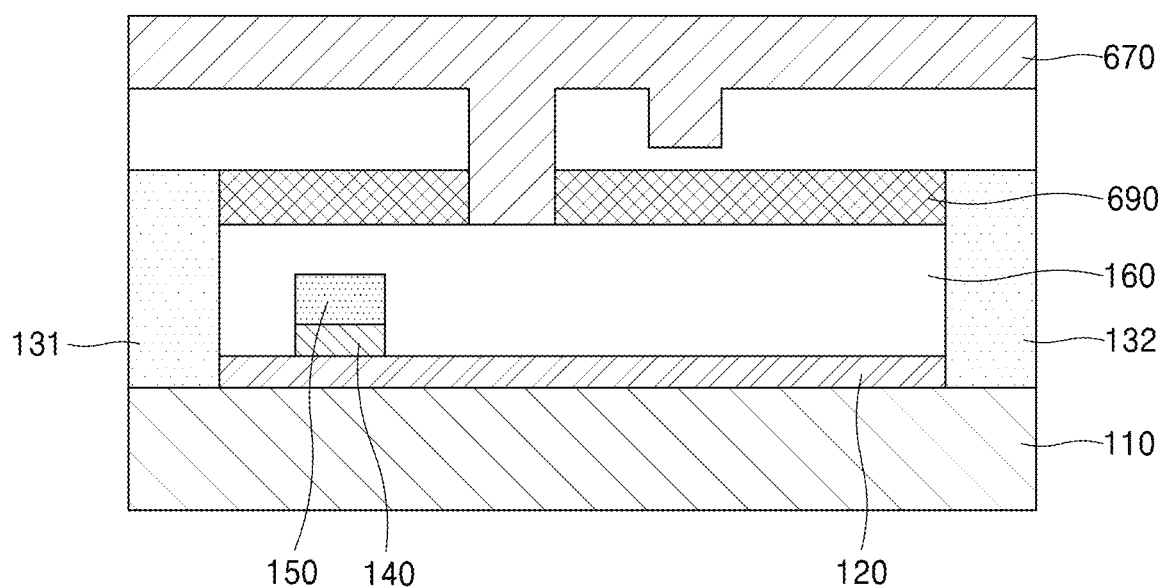
Figure 21:
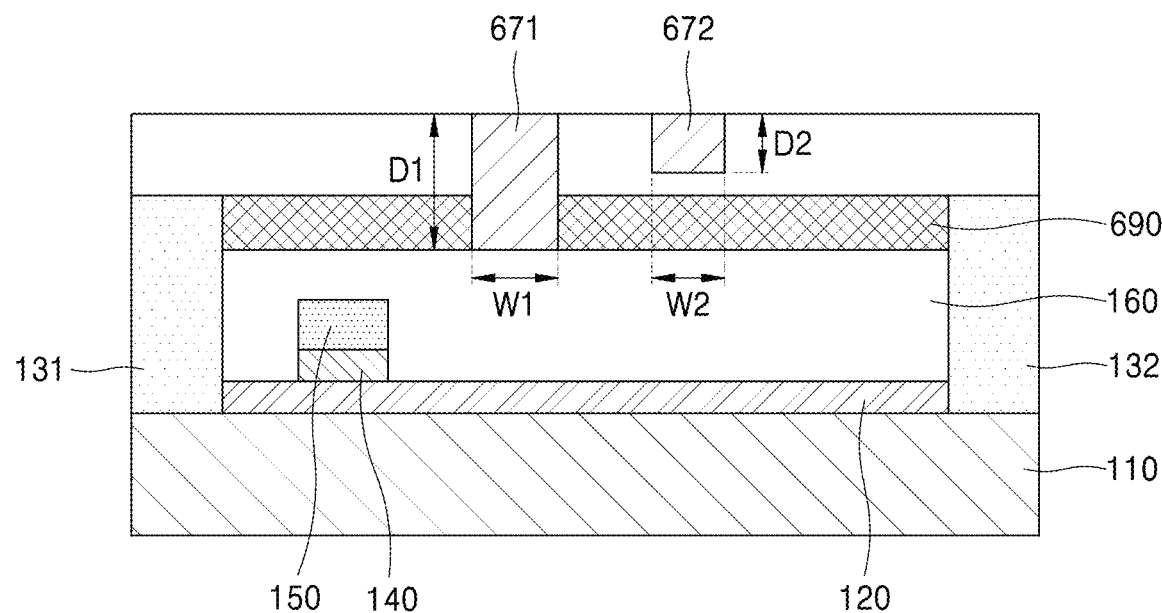

With reference to FIG. 20, a conductive metal layer 670 may be formed on the top surface of the passivation layer 160 to fill the first and second trenches 661 and 662. With reference to FIG. 21, the first and second field plates 671 and 672 may be formed in the first and second trenches 661 and 662 by performing a planarization process to the conductive metal layer 670. Here, the first and second field plates 671 and 672 may be formed to have a thickness which decreases in the direction from the gate 150 toward the drain 132.

According to the foregoing example embodiments, a breakdown voltage of a power device may be increased by providing a plurality of field plates having different thicknesses in a passivation layer between the gate and the drain. Further, by simultaneously forming field plates of different thicknesses at desired locations in the passivation layer through an etching process using microloading effects, a manufacturing process of a power device may be simplified. While embodiments have been particularly described, they are provided merely as an example, and various changes may be made by a person skilled in the art.

Figure 22:
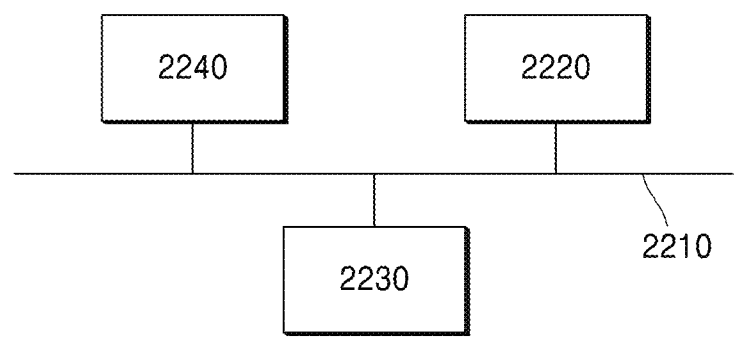
FIG. 22 is a schematic of an electronic device according to another embodiment.

FIG. 22 is a schematic of an electronic device according to another embodiment.

As shown, the electronic device 2200 includes one or more electronic device components, including a processor (e.g., processing circuitry) 2220 and a memory 2230 that are coupled together via a bus 2210.

The processing circuitry 2220, may include processing circuitry such as hardware including logic circuits, a hardware/software combination such as a processor executing software; or a combination thereof. For example, the processing circuitry 2220 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 2230 may include a non-transitory computer readable storage device, for example a solid state drive (SSD), storing a program of instructions, and the processing circuitry 2220 may be configured to execute the program of instructions to implement the functionality of the electronic device 2200.

In some example embodiments, the electronic device 2200 may include one or more additional components 2240, coupled to bus 2210, which may include, for example, a power supply, a light sensor, a light-emitting device, any combination thereof, or the like. In some example embodiments, one or more of the processing circuitry 2220, memory 2230, or one or more additional components 2240 may include one of the power devices 100, 200, or 300 according to example embodiments described above in FIGS. 1-2, 3-4, and 5-6 of the present application.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A power device comprising:
   a channel layer;
   a source and a drain at respective sides of the channel layer;
   a gate on the channel layer between the source and the drain;
   a passivation layer covering the source, the drain and the gate; and
   a plurality of field plates in the passivation layer, wherein the plurality of field plates have different thicknesses,
   the plurality of field plates have different widths, different pattern shapes, or both different widths and different pattern shapes, and
   the plurality of field plates are spaced apart from each other in a direction from the gate toward the drain,
   the plurality of field plates are over a region of the channel layer between the gate and the drain, and
   the plurality of field plates are between the gate and the drain in a plan view.

2. The power device of claim 1,
   wherein distances between the channel layer and the plurality of field plates increase along the direction from the gate toward the drain.

3. The power device of claim 2,
wherein the plurality of field plates decrease in width in the direction from the gate toward the drain.

4. The power device of claim 2,
wherein each of the plurality of field plates include one or more subplates, and
the one or more subplates in the plurality of field plates decrease in size in the direction from the gate toward the drain.

5. The power device of claim 1,
wherein each of the plurality of field plates has a width less than or equal to several micrometers.

6. The power device of claim 1, further comprising:
a barrier layer on the channel layer, the barrier layer configured to form a two dimensional electron gas (2 DEG) in the channel layer; and
a depletion forming layer between the barrier layer and the gate, the depletion forming layer configured to form a depletion region in the 2 DEG.

7. The power device of claim 6,
wherein the channel layer includes a GaN-based material, and
the barrier layer includes at least one of Al, Ga, In, and B.

8. The power device of claim 7,
wherein the depletion forming layer includes a p-type group III-V nitride semiconductor.

9. A power device comprising:
a channel layer;
a source and a drain connected to respective sides of the channel layer;
a gate on the channel layer between the source and the drain;
a passivation layer on the channel layer and covering the source, the drain, and the gate,
the passivation layer defining a plurality of trenches spaced apart from each other over a region of the channel layer between the gate and the drain,
the plurality of trenches having different depths from an upper surface of the passivation layer,
the plurality of trenches including a first trench and a second trench,
a dimension of the first trench being different than a dimension of the second trench; and
a plurality of field plates in the passivation layer, the plurality of field plates including a first field plate in the first trench and a second field plate in the second trench, wherein
the plurality of field plates are between the gate and the drain in a plan view, and
each of the plurality of field plates is spaced apart from gate and the drain in a first direction in which the gate and the drain are separated.

10. The power device of claim 9, wherein
a thickness of the first field plate is greater than a thickness of the second field plate, and
a distance between the drain and the second field plate is less a distance between the drain and the first field plate in a plan view.

11. The power device of claim 9,
a width of the first field plate is greater than a width of the second field plate,
the width of the first field plate and the width of the second field plate are measured in the first direction,
a distance between the drain and the second field plate is less a distance between the drain and the first field plate in a plan view.

12. The power device of claim 9,
a length of the first field plate is greater than a length of the second field plate,
the length of the first field plate and the length of the second field plate are measured in a second direction,
the first direction crosses the second direction, and
a distance between the drain and the second field plate is less a distance between the drain and the first field plate in the plan view.

13. The power device of claim 9, further comprising:
a barrier layer on the channel layer, the barrier layer configured to form a two dimensional electron gas (2 DEG) in the channel layer; and
a depletion forming layer between the barrier layer and the gate, the depletion forming layer configured to form a depletion region in the 2 DEG.

* * * * *